US012580566B2

(12) United States Patent
Englekirk et al.

(10) Patent No.: US 12,580,566 B2
(45) Date of Patent: Mar. 17, 2026

(54) OUTPUT BUFFER FOR A SWAPPABLE SINGLE CONDUCTOR INTERFACE

(71) Applicant: Murata Manufacturing Co., Ltd., Nagaokakyo (JP)

(72) Inventors: Robert Mark Englekirk, Littleton, CO (US); Keith Rampmeier, San Diego, CA (US); Arpita Moghe Chadha, San Diego, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 19 days.

(21) Appl. No.: 18/820,855

(22) Filed: Aug. 30, 2024

(65) Prior Publication Data

US 2024/0421817 A1    Dec. 19, 2024

Related U.S. Application Data

(63) Continuation of application No. PCT/US2023/016951, filed on Mar. 30, 2023, which (Continued)

(51) Int. Cl.
*H03K 17/693* (2006.01)
*H03K 19/0944* (2006.01)
(Continued)

(52) U.S. Cl.
CPC ....... *H03K 17/693* (2013.01); *H03K 19/0944* (2013.01); *H03K 19/17744* (2013.01); *G06F 13/4068* (2013.01); *G06F 13/4282* (2013.01)

(58) Field of Classification Search
CPC .................................................. H03K 17/692
(Continued)

(56) References Cited

U.S. PATENT DOCUMENTS 5,349,214  A    9/1994  Tehrani et al.
5,774,649  A    6/1998  Goh
(Continued)

OTHER PUBLICATIONS

DS2488 1-Wire Dual-Port Link. (Oct. 8, 2020). DS2488 1-Wire Dual-Port Link. Retrieved Jan. 10, 2023, from https:// www.analog. com/en/products/ds2488. html#product-reference (Year: 2020) 31 pages.

(Continued)

*Primary Examiner* — Tomi Skibinski
(74) *Attorney, Agent, or Firm* — Steinfl + Bruno LLP

(57) ABSTRACT

Circuits and methods for determining the characteristics of swappable pins in a peripheral in a 1-Wire or similar single-conductor system, thereby allowing each one of two pins to be either an I/O pin (connected to an I/O line) or a CAP pin (connected to a storage capacitor). Embodiments may utilize a hybrid buffer circuit that utilizes an effectively bi-directional PFET pull-up device coupled between the swappable pins A and B. Two open-drain NFETs pull-down devices are used, one on either side of the PFET and coupled to a respective pin (A or B), but with only one NFET being selected to be operable based on pin-determination flag signals from the pin detection circuitry. Such a hybrid buffer circuit would consume significantly less IC area than two complete conventional buffers, resulting in less leakage and less yield loss.

14 Claims, 12 Drawing Sheets

Related U.S. Application Data is a continuation of application No. 17/711,845, filed on Apr. 1, 2022, now Pat. No. 11,894,840.

(51) Int. Cl.

| | |
|---|---|
| *H03K 19/17736* | (2020.01) |
| *G06F 13/40* | (2006.01) |
| *G06F 13/42* | (2006.01) |

(58) Field of Classification Search

USPC .......................................................... 327/434

See application file for complete search history.

(56)     References Cited

U.S. PATENT DOCUMENTS

| | | | |
|---|---|---|---|
| 9,128,690 B2 | 9/2015 | Lotzenburger et al. | |
| 9,853,606 B2 | 12/2017 | Kanda et al. | |
| 10,236,873 B2 | 3/2019 | Cical et al. | |
| 11,894,840 B2 | 2/2024 | Englekirk et al. | |
| 2011/0181255 A1* | 7/2011 | Hashimoto ......... | H02M 3/1588 |
| | | | 323/272 |
| 2012/0050122 A1 | 3/2012 | Wu et al. | |
| 2021/0036598 A1 | 2/2021 | Summerland | |
| 2023/0318598 A1 | 10/2023 | Englekirk et al. | |

OTHER PUBLICATIONS

International Search Report and Written Opinion issued for Internaitonal Application No. PCT/US2023/016951, filed on Mar. 30, 2023 on behalf of pSemi Corporation. Mail Date: Jul. 31, 2023. 11 Pages.

* cited by examiner

_1000_

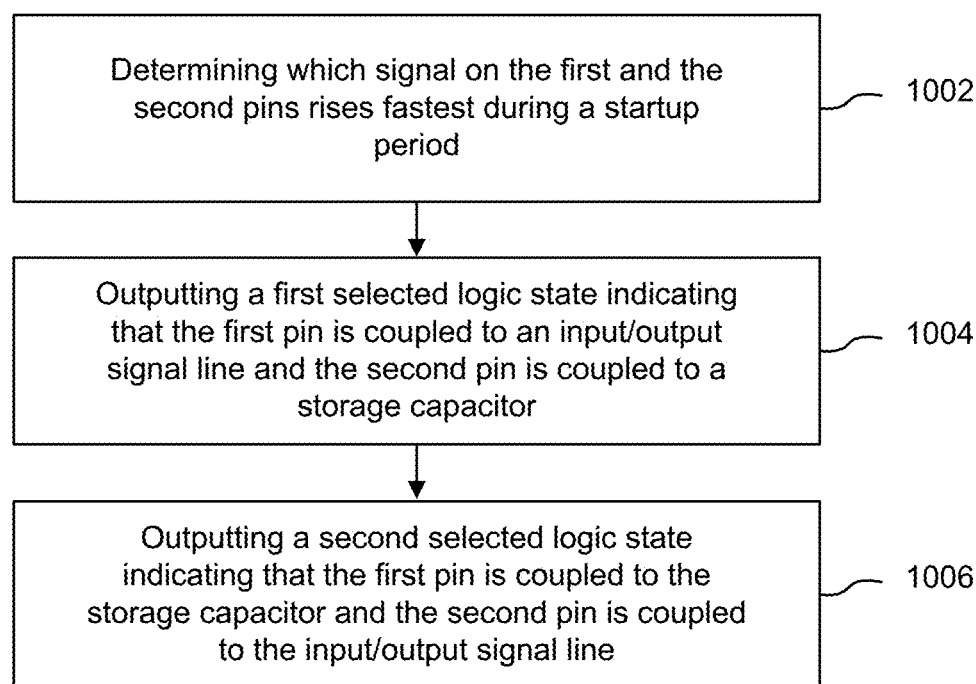

Determining which signal on the first and the second pins rises fastest during a startup period    1002

Outputting a first selected logic state indicating that the first pin is coupled to an input/output signal line and the second pin is coupled to a storage capacitor    1004

Outputting a second selected logic state indicating that the first pin is coupled to the storage capacitor and the second pin is coupled to the input/output signal line    1006

FIG. 10

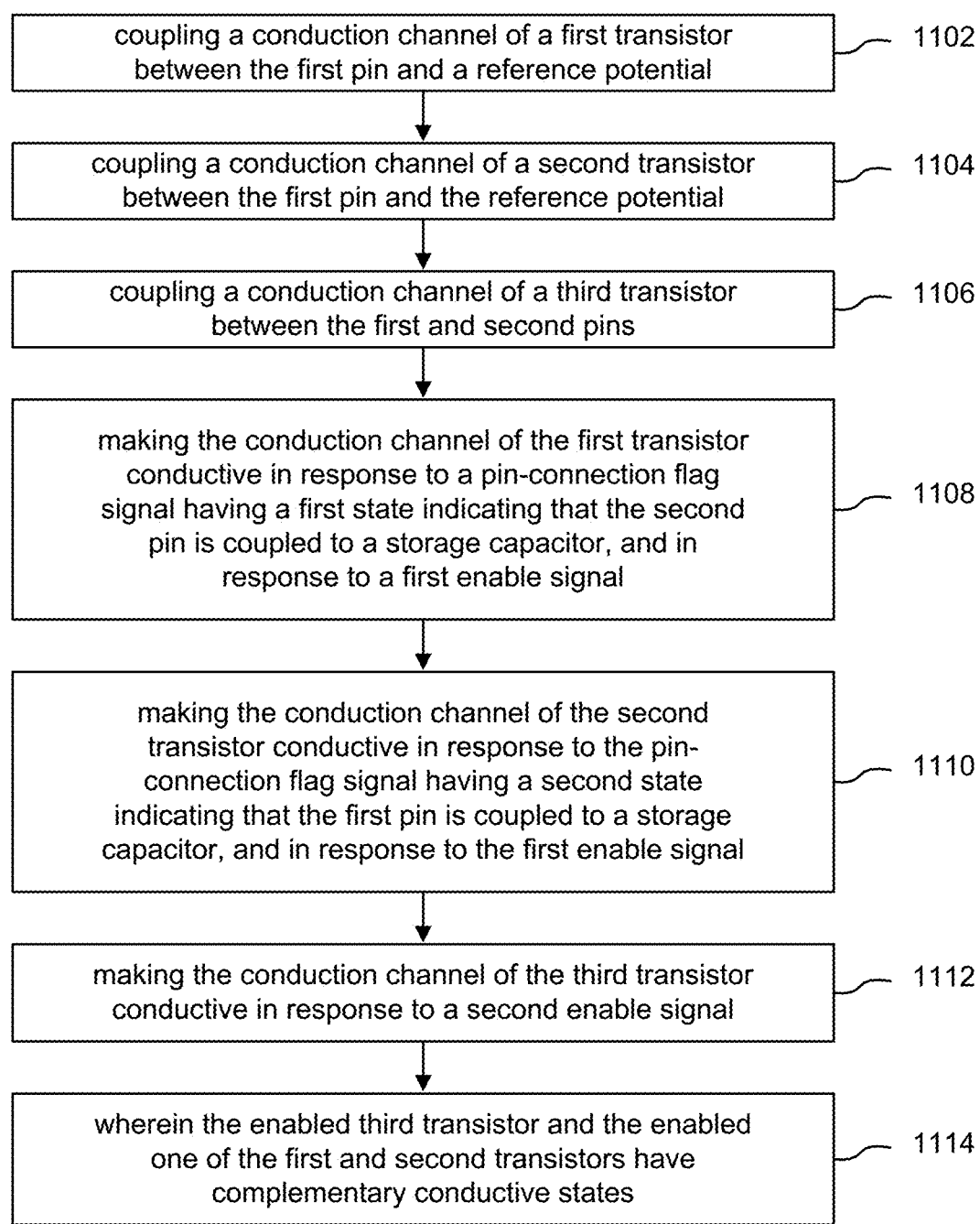

*1100* coupling a conduction channel of a first transistor between the first pin and a reference potential — 1102 coupling a conduction channel of a second transistor between the first pin and the reference potential — 1104 coupling a conduction channel of a third transistor between the first and second pins — 1106 making the conduction channel of the first transistor conductive in response to a pin-connection flag signal having a first state indicating that the second pin is coupled to a storage capacitor, and in response to a first enable signal — 1108 making the conduction channel of the second transistor conductive in response to the pin-connection flag signal having a second state indicating that the first pin is coupled to a storage capacitor, and in response to the first enable signal — 1110 making the conduction channel of the third transistor conductive in response to a second enable signal — 1112 wherein the enabled third transistor and the enabled one of the first and second transistors have complementary conductive states — 1114

FIG. 11

OUTPUT BUFFER FOR A SWAPPABLE SINGLE CONDUCTOR INTERFACE

CROSS-REFERENCE TO RELATED APPLICATIONS

The present application is a continuation of International Application No. PCT/US2023/016951 filed on Mar. 30, 2023, which, in turn, is a continuation of U.S. Non-Provisional patent application Ser. No. 17/711,845, filed on Apr. 1, 2022, for "OUTPUT BUFFER FOR A SWAPPABLE SINGLE CONDUCTOR INTERFACE," now U.S. Pat. No. 11,894,840 issued on Feb. 6, 2024, the contents of all of which are incorporated herein by reference in their entirety.

FIELD

This invention relates to electronic circuits, and more particularly to electronic circuits interconnected by a serial communications bus.

BACKGROUND

1-Wire® is a known device communications bus architecture and protocol that provides data, signaling, and power over a single conductor (despite the "1-Wire" name, all devices must also have a ground connection to permit a return current to flow through the data wire). 1-Wire is a voltage-based digital system that provides half-duplex bidirectional communication. With only two contacts, 1-Wire devices are a very economical way to add electronic functionality to non-electronic objects for identification, authentication, and delivery of calibration data, manufacturing information, sensor output data, and other information.

FIG. 1A is a block diagram of an example 1-Wire system 100. A controller 102 initiates and controls communication with one or more peripherals 104 on a 1-Wire bus. A typical controller 102 includes a Port Control circuit 106 that receives data (RXD) through a buffer 108 and transmits commands and data (TXD) through an open-drain transistor M0, preferably an N-type MOSFET (NFET). In this example, the drain of the NFET is connected to ground when a high voltage (logic 1) is applied to the gate of the NFET device M0. When a low voltage (logic 0) is applied to the gate of the NFET, the drain of the NFET presents a high impedance, and a pull-up resistor R (e.g., 4.7 k (2) connected to a positive voltage supply $V_{DD}$ (e.g., 3V) provides a voltage near $V_{DD}$ on the 1-Wire bus.

FIG. 1B is a block diagram showing a peripheral 104 in greater detail. In many applications, the voltage source may be a "parasitic" type comprising a diode D0 coupled to the 1-Wire bus. The diode D0 supplies voltage from the 1-Wire bus to a storage capacitor C coupled between circuit ground and an internal power bus $V_{DD}$ INT. The diode/capacitor parasitic power supply allows a peripheral 104 to operate for some amount of time even when the 1-Wire bus is pulled to ground. In the illustrated example, the storage capacitor C is external to the peripheral 104, coupled to a CAP terminal or "pin" (in some ultra-low power applications, the storage capacitor C may be internal to the peripheral 104). In any case, when command transmission begins on the 1-Wire bus, storage capacitor C charging is halted, and commands are interpreted in known manner. When a command sequence is over, the storage capacitor C resumes charging.

In some applications, a $V_{DD}$ pin may be coupled to a non-parasitic external voltage source to provide power to internal components to an internal power bus $V_{DD\_INT}$; in the illustrated example, the connection of the $V_{DD}$ pin to the internal power bus $V_{DD\_INT}$ is through a diode D1.

A typical peripheral 104 includes an Interface Control circuit 120 that receives data (RXD) from the 1-Wire bus through an input/output (I/O) pin coupled to a buffer 122 (which may include a Schmitt trigger) and transmits commands and data (TXD) to the 1-Wire bus through an open-drain transistor M1 (e.g., an NFET) coupled to the I/O pin. The Interface Control circuit 120 passes data and commands to a Device Function 124 that includes a unique identification (ID) number. The Device Function 124 may perform a variety of functions, such as sensing humidity and/or temperature, storing local data representing monetary amounts (e.g., for use with transit services or vending machines), and/or serving as a personal or item identifier. A ground pin GND provides a reference potential (circuit ground) and return path to the controller 102, Communication commences when a controller 102 or peripheral 104 briefly pulls the 1-Wire bus low (e.g., connects the pull-up resistor R to ground through its respective output NFET Mx) according to a defined protocol. The 1-Wire bus is high when idle, and thus can also power a limited number of peripherals 104. The 1-Wire bus is considered idle when no device (controller or remote) is pulling the 1-Wire bus to ground, and therefore, the 1-Wire bus will be at a logic 1 state, at or near $V_{DD}$. When any device pulls the 1-Wire bus to ground, the 1-Wire bus will be in a logic 0 state. During idle time, all peripherals 104 will see $V_{DD}$ on their respective I/O line and accordingly the storage capacitor C of any associated parasitic power supply will charge.

SUMMARY

Usage of the 1-Wire communications bus architecture has increased since its introduction, which has spurred demand for greater flexibility in using the technology. The present invention addresses that demand by encompassing circuits and methods for determining the characteristics of swappable pins in a peripheral in a 1-Wire or similar single-conductor system, thereby allowing each one of two pins to be either an I/O pin (connected to an I/O line like the 1-Wire bus) or a CAP pin (connected to a line coupled to a storage capacitor C). The present invention further encompasses circuits and methods that provide an output buffer for a swappable single-conductor interface, and both slow charging and fast charging for the storage capacitor C.

Allowing the I/O and CAP pins to be swappable provides for greater flexibility in laying out printed circuit boards (PCBs) and circuit modules. For example, it is sometimes beneficial in laying out PCBs and circuit modules to use "left-handed" and "right-handed" versions of the same part in order to reduce area and/or coupling. However, it is undesirable to have two versions of a part just to satisfy that criterion. A single integrated circuit chip having suitably-positioned swappable pins may be used as either a left-handed or a right-handed component.

Another advantage of having swappable I/O and CAP pins is that detection of each possible configuration allows use of two different device IDs for a 1-Wire system peripheral, thereby enabling the possibility of different behavior as a function of pin connections. Changing the ID of a part allows two otherwise identical parts to be differentiated in serial communications.

Embodiments of the present invention perform the following functions: detecting the initial phase of device startup; determining which of pins A and B is coupled to an I/O line like the 1-Wire bus (and thus is the I/O pin), and which of pins A and B is coupled to the storage capacitor C (and thus is the CAP pin); and generating a flag signal indicating that determination, which may be used by other circuitry within the peripheral. Detection of pin characteristics is determined at device startup by latching a logic signal to represent the fastest rising signal on the lines (I/O and CAP) coupled to pins A and B, flagging that latched signal line as being the I/O line, and preventing further changes to the latch output until the next startup cycle.

Embodiments also may utilize a hybrid buffer circuit that utilizes a PFET pull-up device coupled between the swappable pins A and B. The PFET pull-up device is effectively bi-directional, connecting the pin (A or B) connected to the CAP line to the pin (B or A) connected to the I/O line when a peripheral needs to signal a HIGH output. Two open-drain NFETs pull-down devices are used, one on either side of the PFET and coupled to a respective pin (A or B), but with only one NFET being selected to be operable based on pin-determination flag signals from the pin detection circuitry. Such a hybrid buffer circuit would consume significantly less IC area than two complete conventional buffers, resulting in less leakage and less yield loss.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 10 is a process flow chart showing one method for determining the characteristics of respective signals on a first pin and a second pin of a peripheral configured to be coupled to a single-conductor communications bus.

FIG. 11 is a process flow chart showing one method for coupling electronic signals to a swappable single conductor interface having a first pin and a second pin.

Like reference numbers and designations in the various drawings indicate like elements if the context requires.

DETAILED DESCRIPTION

Usage of the 1-Wire communications bus architecture has increased since its introduction, which has spurred demand for greater flexibility in using the technology. The present invention addresses that demand by encompassing circuits and methods for determining the characteristics of swappable pins in a peripheral in a 1-Wire or similar single-conductor system, thereby allowing each one of two pins to be either an I/O pin (connected to an I/O line like the 1-Wire bus) or a CAP pin (connected to a line coupled to an external storage capacitor C). The present invention further encompasses circuits and methods that provide an output buffer for a swappable single-conductor interface, and both slow charging and fast charging for the storage capacitor C.

Pin Detection for Single Conductor Interface

Allowing the I/O and CAP pins to be swappable provides for greater flexibility in laying out printed circuit boards (PCBs) and circuit modules. For example, it is sometimes beneficial in laying out PCBs and circuit modules to use "left-handed" and "right-handed" versions of the same part in order to reduce area and/or coupling. However, it is undesirable to have two versions of a part just to satisfy that criterion. A single integrated circuit chip having suitably-positioned swappable pins could be used as either a left-handed or a right-handed component.

Another advantage of having swappable I/O and CAP pins is that detection of each possible configuration allows use of two different device IDs for a 1-Wire system peripheral, thereby enabling the possibility of different behavior as a function of pin connections. Changing the ID of a part allows two otherwise identical parts to be differentiated in serial communications.

Figure 2:
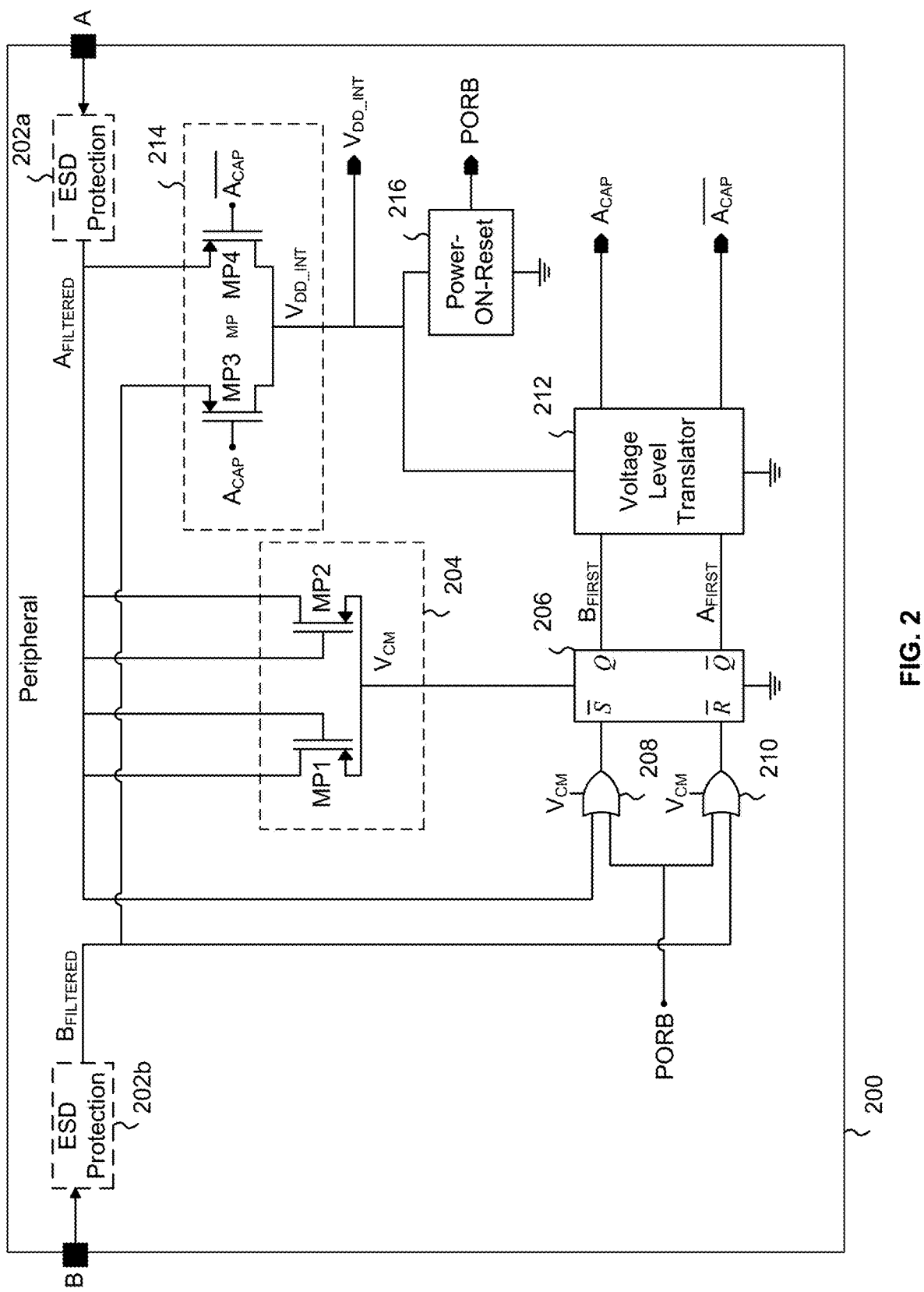
FIG. 2 is a schematic diagram of a single-conductor peripheral having swappable pins A and B, either of one of which may be used as either an I/O pin or a CAP pin.

FIG. 2 is a schematic diagram of a single-conductor peripheral 200 having swappable pins A and B, either of one of which may be coupled to an I/O line or a CAP line. For example, in a first configuration, pin A may be the I/O pin while pin B may be the CAP pin. In a second configuration, pin B may be the I/O pin while pin A may be the CAP pin. In the illustrated example, with pins A and B on opposite sides of the peripheral 200 layout, the peripheral 200 may be used as either a "left-handed" or a "right-handed" embodiment.

The illustrated circuitry of the peripheral 200 performs the following functions: detecting the initial phase of device startup; determining which of pins A and B is coupled to an I/O line like the 1-Wire bus (and thus is the I/O pin), and which of pins A and B is coupled to the storage capacitor C (and thus is the CAP pin); and generating a flag signal indicating that determination, which may be used by other circuitry within the peripheral. Detection of pin characteristics is determined at device startup by latching a logic signal to represent the fastest rising signal on the lines (I/O and CAP) coupled to pins A and B, flagging that latched signal line as being the I/O line, and preventing further changes to the latch output until the next startup cycle.

In the illustrated example, each of pins A and B is coupled to a respective optional secondary electrostatic discharge (ESD) protection circuit 202a, 202b. Many 1-Wire peripherals include a primary ESD protection circuit (not shown). However, in some applications, including the secondary ESD protection circuits 202a, 202b is shown to enhance protection for gated inputs within the peripheral 200 from ESD events. The secondary ESD protection circuits 202a, 202*b* may be any suitable ESD circuit, including a transient voltage suppression diode or a Zener diode. Note that while the secondary ESD protection circuits 202*a*, 202*b* are shown in a series configuration interposed between a respective pin A, B and the remaining circuitry in the peripheral 200, in many cases the secondary ESD protection circuits 202*a*, 202*b* may be coupled in a shunt configuration to the signal lines emanating from the A and B pin into the peripheral 200.

If secondary ESD protection circuits 202*a*, 202*b* are included in the peripheral 200, their respective output comprises filtered versions $A_{FILTERED}$, $B_{FILTERED}$ of the signals applied to the corresponding A and B pins. For purposes of this disclosure, it is assumed that the secondary ESD protection circuits 202*a*, 202*b* are present and have a shunt configuration, and accordingly reference will be made to the filtered versions $A_{FILTERED}$, $B_{FILTERED}$ of the signals applied to the corresponding A and B pins. If the secondary ESD protection circuits 202*a*, 202*b* are not used in a particular embodiment, then references to $A_{FILTERED}$ and $B_{FILTERED}$ should be taken as being the respective signals applied to the corresponding A and B pins.

A MAX A/B circuit 204 provides an output voltage $V_{CM}$ that is the greater of $A_{FILTERED}$ or $B_{FILTERED}$, thus effectively filtering out excursions in voltage on either line (e.g., from signaling on the I/O line) and providing a continuous power supply to an active-LOW Set-Reset (S'R') latch 206 and associated OR gates 208 and 210. The MAX A/B circuit 204 in the illustrated example includes a first P-type MOS-FET (PFET) MP1 having a conduction channel (between drain and source) coupled to the $A_{FILTERED}$ line and a gate coupled to the $B_{FILTERED}$ line, as well as a second PFET MP2 having a conduction channel coupled to the $B_{FILTERED}$ line and a gate coupled to the $A_{FILTERED}$ line. The sources of MP1 and MP2 are coupled together and provide $V_{CM}$ to power the S'R' latch 206 when $B_{FILTERED} < A_{FILTERED}$ ($V_{CM}$ is based on power through MP1 from the $A_{FILTERED}$ line) or when $B_{FILTERED} > A_{FILTERED}$ ($V_{CM}$ is based on power through MP2 from the $B_{FILTERED}$ line). The result is that the S'R' latch 206 can be quickly powered at startup of the peripheral 200 by the I/O and CAP signal lines coupled to respective ones of the A and B pins.

In the illustrated example, the S'R' latch 206 is configured to receive $A_{FILTERED}$ at an S input through a SET OR gate 210, and to receive $B_{FILTERED}$ at an $\overline{R}$ input through a RESET OR gate 210. The S'R' latch 206 is designed to start in a balanced state at startup (i.e., both Q and $\overline{Q}$ are low before startup) and flips one way or the other based on the inputs from the $A_{FILTERED}$ and $B_{FILTERED}$ lines. Of course, the inputs to S'R' latch 206 may be reversed if logic adjustments are made as to the meaning of the Q and $\overline{Q}$ outputs.

Figure 3:
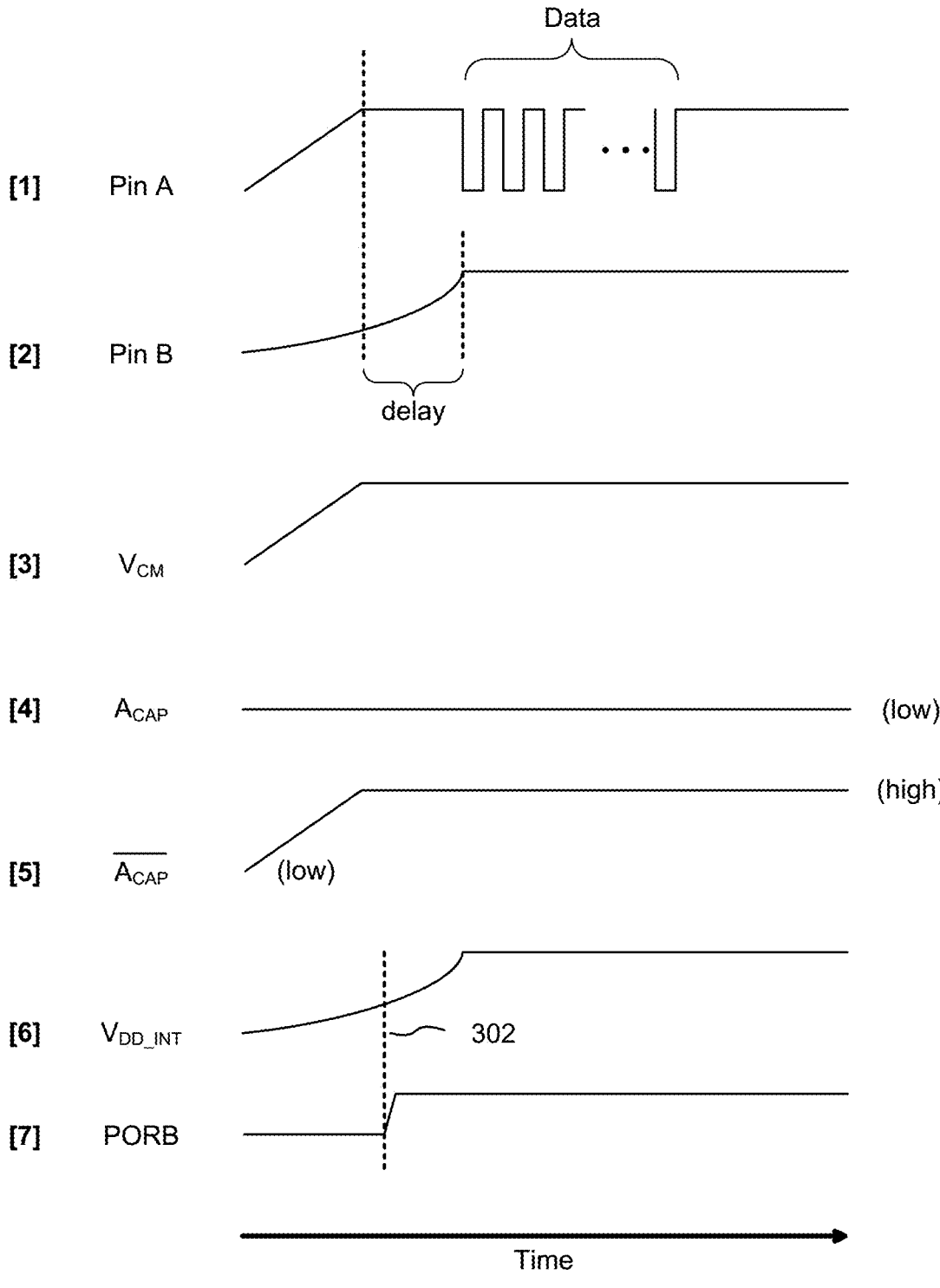
FIG. 3 is a set of voltage signals [1]-[7] as a function of time for various nodes within the example circuit shown in FIG. 2.

FIG. 3 is a set of voltage signals [1]-[7] as a function of time for various nodes within the example circuit shown in FIG. 2 (note that the amplitude of any voltage signal may be on a different scale than other voltage signals). During startup of the peripheral 200, it is assumed that the voltage on the CAP line (coupled to one of pins A and B) will be significantly lower during initial startup than the voltage on the I/O line (coupled to the other one of pins A and B), owing to the time it takes for the relatively large storage capacitor C to charge fully (keeping in mind that the storage capacitor C generally would have no charge at startup). Assuming that pin A is coupled to the I/O line and pin B is coupled to the CAP line, then voltage signals [1] and [2] show the relative rise in voltage as a function of time for an I/O signal (voltage signal [1]) versus the voltage on the CAP line (voltage signal [2]). Concurrently, $V_{CM}$ will "follow" the greater of the voltage signals applied to either pin A or pin B (see voltage signal [3] in FIG. 3), and thus will rise when the I/O line rises (on pin A in this example). Note that if pin A is coupled to the CAP line and pin B is coupled to the I/O line, then voltage signals [1] and [2] will be swapped but voltage signal [3] will remain the same.

As should be clear from FIG. 3, the I/O line signal on pin A will reach a HIGH level before the delayed CAP line signal on pin B. That delay difference means that the $B_{FILTERED}$ signal (corresponding to the CAP line in this example) at the $\overline{R}$ input will still be LOW when the $A_{FILTERED}$ signal (corresponding to the I/O line in this example) at the $\overline{S}$ input reaches a HIGH level. Accordingly, the Q output (the $B_{FIRST}$ signal) of the S'R' latch 206 will be LOW and the $\overline{Q}$ output (the $A_{FIRST}$ signal) will be HIGH (meaning pin A is coupled to the I/O line and pin B is coupled to the CAP line). The belated rise of the $B_{FILTERED}$ signal from LOW to HIGH will not change the output of the S'R' latch 206. As discussed below, a Power-ON Reset signal PORB is eventually applied to the SET OR gate 210 and the RESET OR gate 210 to prevent any data signal transitions on the I/O line from altering the output state of the S'R' latch 206.

In many applications, it is advisable to utilize a logic level translator 212 to translate the voltage levels output by the S'R' latch 206 to levels compatible with the internal voltage supply $V_{DD\_INT}$ from a supply switch circuit (see details below), and more specifically from the range of 0V-$V_{CM}$ to the range 0V-$V_{DD\_INT}$. In the illustrated example, the logic level translator 212 voltage translates the output signals from the S'R' latch 206. If $A_{FIRST}$=HIGH and $B_{FIRST}$=LOW, then the logic level translator 212 will output $A_{CAP}$=LOW and $\overline{A_{CAP}}$=HIGH (meaning that the CAP line is not coupled to pin A, but rather is coupled to pin B); see voltage signals [4] and [5] in FIG. 3. Conversely, assuming that pin A is coupled to the CAP line and pin B is coupled to the I/O line, then the logic level translator 212 will output $A_{CAP}$=HIGH and $\overline{A_{CAP}}$=LOW (meaning that the CAP line is coupled to pin A).

The $A_{CAP}$ and $\overline{A_{CAP}}$ signals are coupled to a supply switch circuit 214, and more specifically to respective gates of PFETs MP3 and MP4 in the illustrated example. The conduction channel of MP3 is coupled to pin B and the conduction channel of MP4 is coupled to pin A (note that MP3 and MP4 are typically tied directly to pins A and B, not $A_{FILTER}$ and $B_{FILTER}$; if the secondary ESD protection circuits 202*a*, 202*b* are shunt circuits—assumed to be the case in the illustrated example—then A=$A_{FILTER}$ and B=$B_{FILTER}$). The drains of MP3 and MP4 are coupled and comprise an internal voltage supply $V_{DD\_INT}$ output.

At startup, the $A_{CAP}$ and $\overline{A_{CAP}}$ signals will be at 0V, so both PFETs MP3 and MP4 will be ON (conducting) since the respective gates of MP3 and MP4 will be negative relative to their respective sources. With both MP3 and MP4 ON, the I/O line (regardless of whether coupled to pin A or B) and the CAP line (again, regardless of whether coupled to pin A or B) will be coupled together. The result is that the coupled lines will provide an internal voltage supply $V_{DD\_INT}$, and voltage on the I/O line will begin to charge the storage capacitor C through the CAP line. Of note, one of the PFETs MP3 and MP4 will transition to an OFF (blocking) state when the corresponding signal applied to the respective gate switches to HIGH. Thus, if $A_{CAP}$=HIGH, then MP3 will turn OFF, and conversely, if $\overline{A_{CAP}}$=HIGH, then MP4 will turn OFF. However, note that even though the gate of MP3 or MP4 may be high for $V_{DD\_INT}$ based logic, the device may not be OFF until $V_{DD\_INT}$ reaches a nearly fully charged state (A≈B). Before that time, the device will continue to aid in charging both $V_{DD\_INT}$ and the storage capacitor C.

As voltage signal [6] in FIG. 3 indicates, the internal voltage supply $V_{DD\_INT}$ takes some time to rise to its highest level, owing to the time it takes for the relatively large storage capacitor C to charge fully and due to the capacitance of other circuits (not all shown) coupled to the internal voltage supply $V_{DD\_INT}$.

TABLE 1 below summarizes the input and output states of the S'R' latch 206:

TABLE 1

| S' | R' | Q | $\overline{Q}$ |
|----|----|----|----|
| 0 | 0 | undefined | undefined |
| 0 | 1 | 1 | 0 |
| 1 | 0 | 0 | 1 |
| 1 | 1 | no change to prior state of output | |

TABLE 2 below summarizes the function of the illustrated peripheral 200:

TABLE 2

| S'R' Latch Inputs | Pin A | Pin B | $A_{CAP}$ | $\overline{A_{CAP}}$ |
|----|----|----|----|----|
| If pin A rises faster than pin B I/O line | CAP line | LOW | HIGH | |
| If pin B rises faster than pin A CAP line | I/O line | HIGH | LOW | |

If a logic level translator 212 is not needed, then the $A_{FIRST}$ and $B_{FIRST}$ signals may be applied to the gates of the PFETs MP3 and MP4 in place of the $\overline{A_{CAP}}$ and $A_{CAP}$ signals, respectively (possibly with a buffer or inverter in between if needed to drive MP3 and MP4).

The internal voltage supply $V_{DD\_INT}$ is coupled to a conventional Power-ON-Reset (POR) circuit 216. The POR circuit 216 provides a predictable, regulated voltage after the initial application of power to the peripheral 200. Once the internal voltage supply $V_{DD\_INT}$ rises above a selected threshold or "Power Good" level (see dotted line 302 superimposed on voltage signal [6] in FIG. 3), an output logic signal PORB of the POR circuit 216 will rise from 0V (in startup condition) to a HIGH state ($\approx V_{DD\_INT}$); see voltage signal [7] in FIG. 3. At this point, application of the HIGH state of PORB to the SET OR gate 210 and the RESET OR gate 210 prevents any post-startup data signal transitions on the I/O line from altering the output state of the S'R' latch 206 (see signal line [1] in FIG. 3 for an example of data signal transitions on the I/O line).

As should be clear, either of the $A_{CAP}$ or $\overline{A_{CAP}}$ comprise flag signals that may be used to indicate which of pin A or B is coupled to the I/O line or the CAP line, and thus may be used by other circuitry within the peripheral 200 to control behavior. For example, assertion of $A_{CAP}$=LOW may cause other circuitry to treat pin A as being coupled to the I/O line (e.g., the 1-Wire bus), and conversely, assertion of $A_{CAP}$=HIGH may cause such other circuitry to treat pin B as being coupled to the I/O line. A multiplexer or the like can be used to selectively connect such other circuitry (e.g., an input buffer 122 or an open-drain output transistor Mx for transmissions) to pin A or pin B using either of the $A_{CAP}$ or $\overline{A_{CAP}}$ signals as a selector bit. As another example, the state of either of the $A_{CAP}$ or $\overline{A_{CAP}}$ signals may be used to define an ID for the peripheral 200—for example, if $A_{CAP}$ is LOW, then the ID may have first value, while if $A_{CAP}$ is HIGH, then the ID may have second value. In any case, the supply switch 214 will provide the internal voltage supply $V_{DD\_INT}$ to other circuitry regardless of whether the CAP line is coupled to pin A or pin B.

Pin Detection for Single Conductor Interface—Embodiment Details

Figure 4:
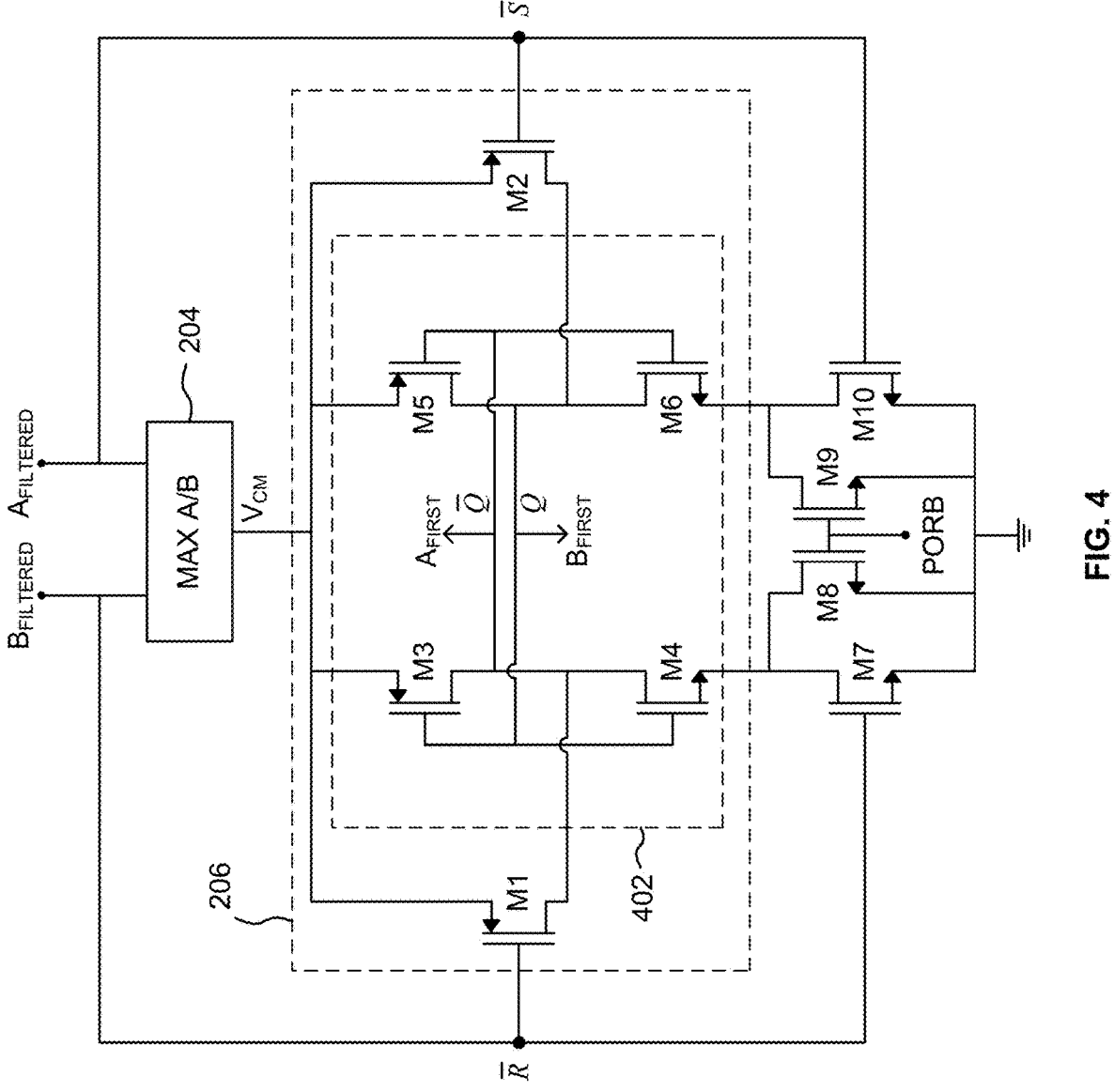
FIG. 4 is a schematic diagram of one embodiment of an S'R' latch and associated SET OR gate and RESET OR gate that may be used in the peripheral of FIG. 2.

FIG. 4 is a schematic diagram of one embodiment of an S'R' latch 206 and associated SET OR gate and RESET OR gate that may be used in the peripheral 200 of FIG. 2. Power to the S'R' latch 206 is provided by the MAX A/B circuit 204 as described above. The SET OR gate 208 of FIG. 2 comprises PFET M2 and NFETs M9 and M10, while the RESET OR gate 210 of FIG. 2 comprises PFET M1 and NFETs M7 and M8. A set of four FETs (PFET M3, NFET M4, PFET M5, and NFET M6) comprise a conventional latch core 402 for the active-LOW S'R' latch.

In the example embodiment of FIG. 4, PFETs M1 and M2 can be made relatively weak (i.e., having a relatively high ON resistance $R_{ON}$) devices which cannot flip the latch on their own (i.e., M7 and M8 or M9 and M10 would both have to be OFF). More conventionally, a second PFET could be added above or below both M1 and M2 and connected to PORB. However, the use of "weak" devices for PFETs M1 and M2 saves at least two relatively large transistor devices.

During startup, PFET M2 and NFET M10 are controlled by the $A_{FILTERED}$ signal and force the latch core 402 to the Set state if $B_{FILTERED}$>$A_{FILTERED}$—thus, the Q output (the $B_{FIRST}$ signal) of the latch core 402 will be HIGH and the $\overline{Q}$ output (the $A_{FIRST}$ signal) will be LOW (meaning pin B is coupled to the I/O line and pin A is coupled to the CAP line). Similarly, during startup, PFET M1 and NFET M7 are controlled by the $B_{FILTERED}$ signal and force the latch core 402 to the Reset state if $A_{FILTERED}$>$B_{FILTERED}$—thus, the Q output (the $B_{FIRST}$ signal) of the latch core 402 will be LOW and the $\overline{Q}$ output (the $A_{FIRST}$ signal) will be HIGH (meaning pin A is coupled to the I/O line and pin B is coupled to the CAP line).

Once communications on the I/O line starts, resulting in the (now determined) I/O pin dropping at times to 0V, the S'R' latch 206 remains operational because $V_{CM}$ will still be supplied by the MAX A/B circuit 204 (because the CAP line is HIGH), and only PFETs M1 and M2 can affect the state of the latch core 402. If M1 and M2 are chosen as relatively weak devices with respect to other devices within the circuit, the S'R' latch 206 cannot change state until the next startup cycle. Alternately, additional transistor devices can be placed above or below M1 and M2 with gates tied to PORB.

As should be clear to one of ordinary skill in the art, the functions of the latch core 402 and the controlling SET 208 and RESET 210 gates may be implemented with other specific devices and/or circuit configurations without departing from the teachings of this disclosure.

Figure 5:
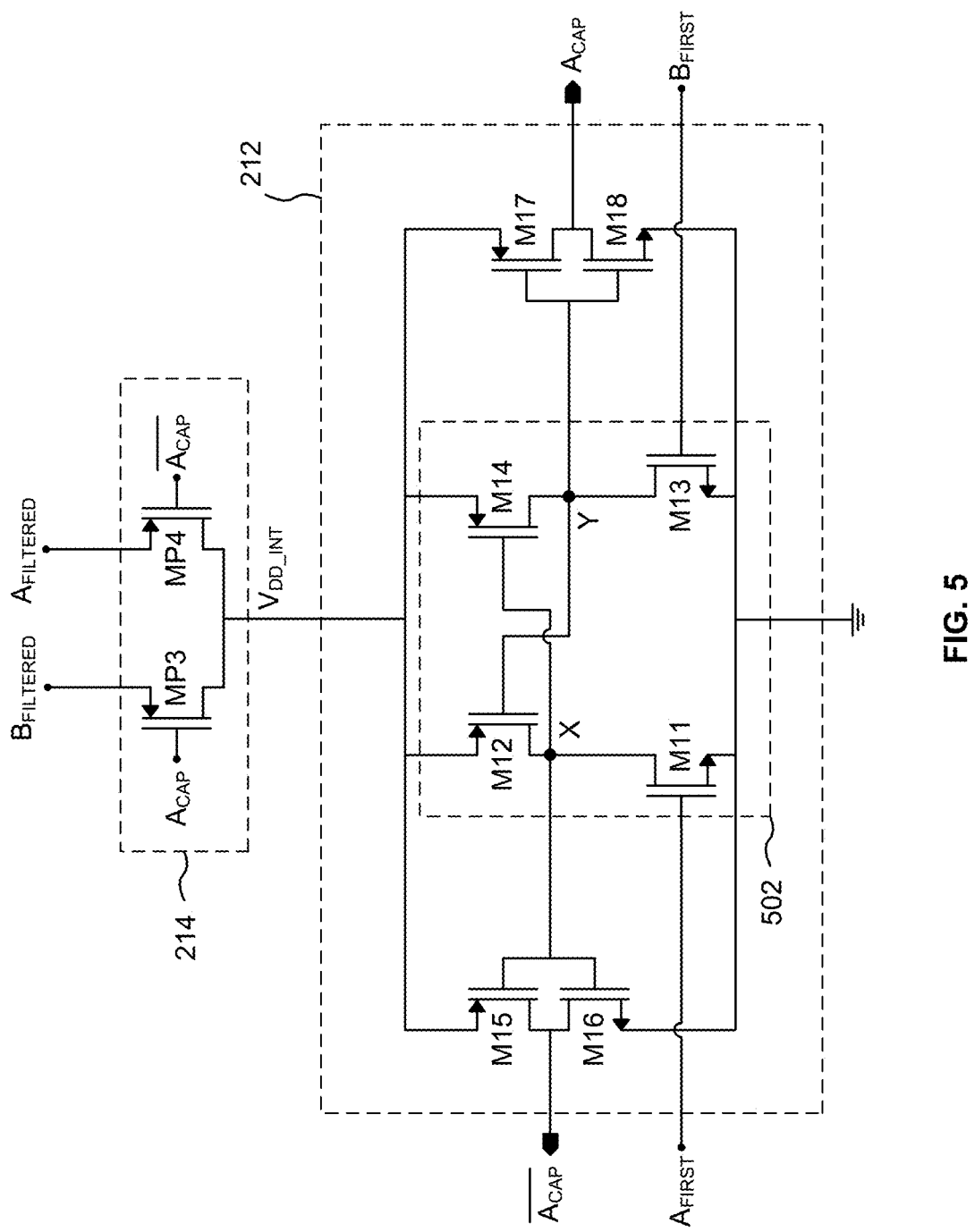
FIG. 5 is a schematic diagram of one embodiment of a logic level translator that may be used in the peripheral of FIG. 2.

FIG. 5 is a schematic diagram of one embodiment of a logic level translator 212 that may be used in the peripheral 200 of FIG. 2. The supply switch circuit 214 described above provides $V_{DD\_INT}$ to the logic level translator 212. A set of four FETs (NFET M11, PFET M12, NFET M13, and PFET M14) comprise a level translation core 502 that translates the voltage of inputs $A_{FIRST}$ and $B_{FIRST}$ from the range of 0V-$V_{CM}$ to the range 0V-$V_{DD\_INT}$ in known fashion, resulting in inverted voltage translated outputs at nodes X and Y, respectively. PFET/NFET pairs M15, M16 and M17, M18 each comprise inverters that invert the signals at nodes X and Y, resulting in the $A_{CAP}$ and $\overline{A_{CAP}}$ signals described above.

As should be clear to one of ordinary skill in the art, the functions of the level translation core 502 and inverters within the logic level translator 212 may be implemented with other specific devices and/or circuit configurations without departing from the teachings of this disclosure.

Output Buffer for a Swappable Single-Conductor Interface

Figure 1A:
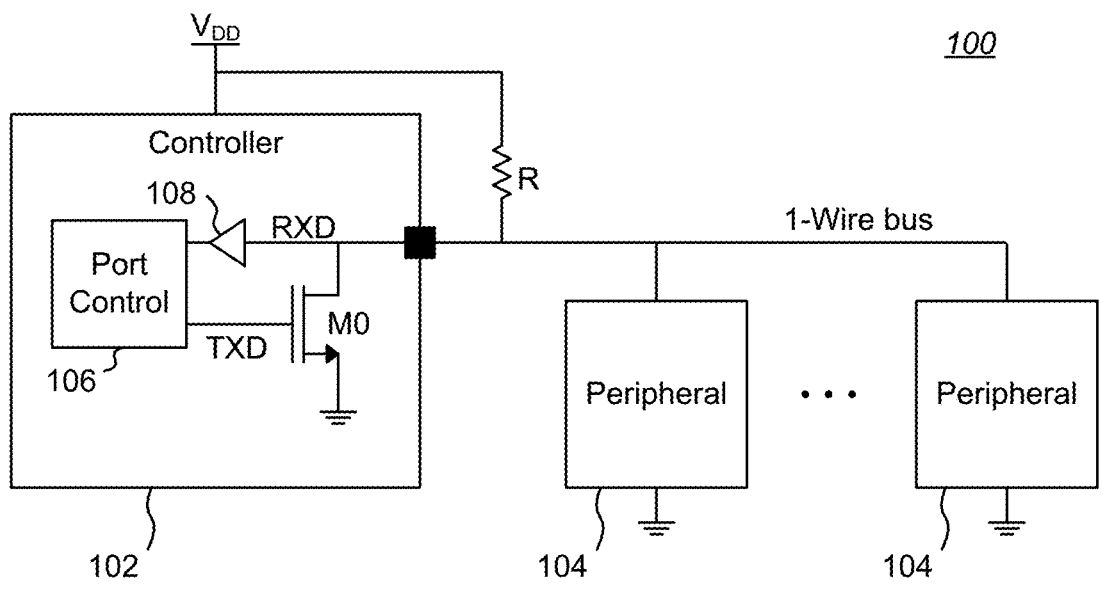
FIG. 1A is a block diagram of an example 1-Wire system.
Figure 1B:
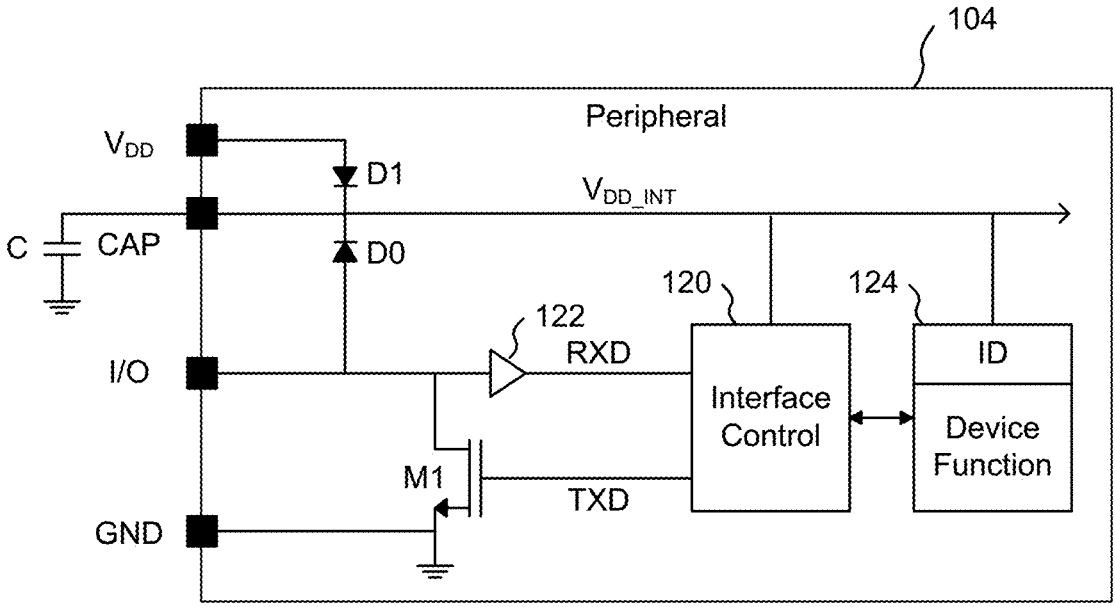
FIG. 1B is a block diagram showing a peripheral in greater detail.

Use of a swappable-pin interface in a peripheral means that conventional circuitry for charging the storage capacitor C and for transmitting commands and data will not work for certain configurations. Referring to FIG. 1B as an example, if the I/O line and CAP line connections to the I/O and CAP pins are swapped, the one-way charging diode D0 will be oriented backwards and the open-drain transistor M1 would be coupled to the CAP line instead of the I/O line. With two possible output pins, A or B, an output buffer is needed that can drive either pin separately, and a charging circuit is required that can properly charge the CAP line from the I/O line regardless of A and B pin connections.

Output buffers usually have to drive a significant amount of capacitive load and thus generally use large-area transistor devices. One option for a swappable-pin interface is to utilize two complete buffers, each coupled to a respective pin (A or B). Another option would be to use one output buffer with a supply switch and an output switch, thus requiring 3 devices in series. Either of these options results in consumption of a large amount of integrated circuit (IC) area, leakage current, and yield loss.

A better option for a swappable full-output buffer is to utilize a hybrid buffer circuit that utilizes a single PFET pull-up device or device stack (rather than two such devices or device stacks in a conventional two-buffer circuit) coupled between the swappable pins A, B, one of which would be coupled to the CAP line (and thus to the storage capacitor C) and the other of which would be coupled to the I/O line. The insight here is that only one PFET is needed to implement signaling in either direction. The PFET pull-up device is effectively bi-directional, connecting the pin (A or B) connected to the CAP line to the pin (B or A) connected to the I/O line when a peripheral needs to signal a HIGH output. Two open-drain NFETs pull-down devices are still needed, one on either side of the PFET and coupled to a respective pin (A or B), but with only one NFET being selected to be operable (meaning capable of responding to other inputs, as opposed to be unresponsive to any other inputs) based on the pin-determination flag signals from pin detection circuitry of the type shown in FIG. 2. Only when the PFET pull-up device is OFF would one of the NFET pull-down devices be ON to signal a LOW output on a respective pin (either A or B), for signaling commands and/or data. Of note, such a hybrid buffer circuit would consume significantly less IC area than two complete conventional buffers, resulting in less leakage and less yield loss.

Figure 6A:
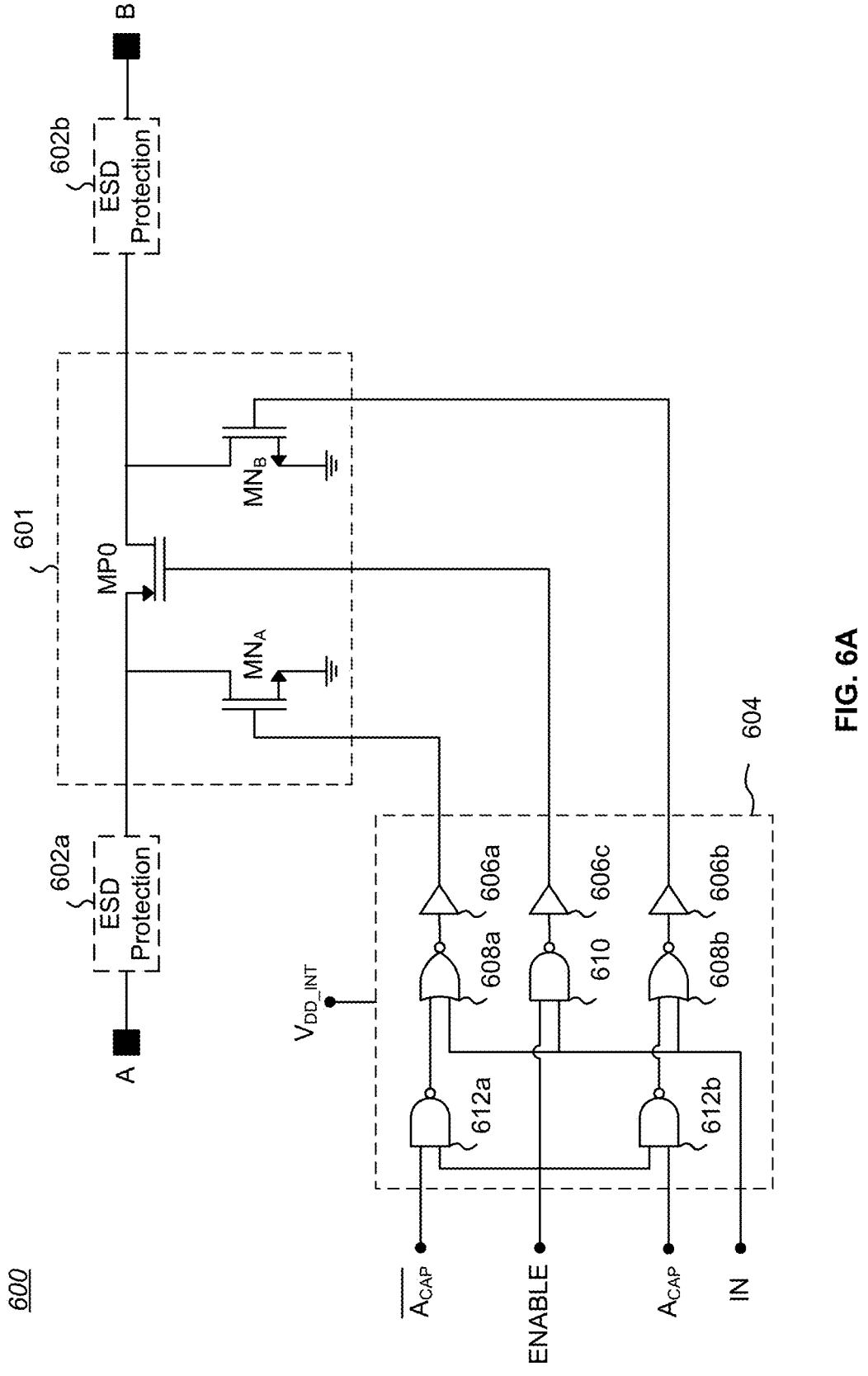
FIG. 6A is a schematic diagram of a hybrid output buffer for a swappable single conductor interface.

FIG. 6A is a schematic diagram of a hybrid output buffer 600 for a swappable single conductor interface. Pins A and B each can be coupled either to an I/O line or a CAP line. The A and B pins may be coupled to secondary electrostatic discharge (ESD) protection circuits 602a, 602b. A hybrid driver 601 includes a PFET MP0 and NFETs $MN_A$ and $MN_B$. PFET MP0 has its conduction channel coupled between pins A and B (through the ESD protection circuits 602a, 602b if present). NFETs $MN_A$ and $MN_B$ have their conduction channels coupled between a respective pin A or B and a reference potential (e.g., circuit ground), and are positioned on opposite sides of MP0.

A driver control circuit 604 includes respective output connections to the gates of MP0, $MN_A$, and $MN_B$. Inputs to the driver control circuit 604 include an input line IN for command and data signals, at least one ENABLE signal line (only one is shown in this example) that controls overall operation of the control circuit 602, and at least one pin-connection flag signal, such as the $A_{CAP}$ and $\overline{A_{CAP}}$ signals from the circuit shown in FIG. 2. (Note that since $A_{CAP}$ and $\overline{A_{CAP}}$ are complementary signals, only one of those flag signals need be coupled to the driver control circuit 604 since the complement may be generated internally; for ease of understanding, both flag signals are shown as inputs to the driver control circuit 604 in the illustrated embodiment).

In the illustrated example, the driver control circuit 604 includes a set of buffer circuits 606a-606c for drive strength for the gates of $MN_A$, $MN_B$, and MP0. The buffer circuits 606a-606c may be implemented, for example, as an even number of inverters coupled in series. The input to buffer circuit 606a is from a NOR gate 608a, the input to buffer circuit 606b is from a NOR gate 608b, and the input to buffer circuit 606c is from a NAND gate 610. One input to NOR gate 608a is from a NAND gate 612a, while one input to NOR gate 608b is from a NAND gate 612b. Inputs to NAND gate 610 are the ENABLE signal and the IN signal. Inputs to NAND gate 612a are the ENABLE signal and the $\overline{A_{CAP}}$ flag signal, while inputs to NAND gate 612b are the ENABLE signal and the $A_{CAP}$ flag signal, The $A_{CAP}$ and $\overline{A_{CAP}}$ pin-connection flag signals to the driver control circuit 604 are complementary signals that control which of NFETs $MN_A$ and $MN_B$ are operable. If $A_{CAP}$ is HIGH and $\overline{A_{CAP}}$ is LOW—meaning that the CAP line is coupled to pin A—then only $MN_B$ is operable (subject to being fully enabled by the ENABLE signal or signals to the driver control circuit 604). Thus, $MN_B$ is fully enabled, and thereafter controlled by the IN signal, when ENABLE=HIGH and $A_{CAP}$ is HIGH.

Conversely, if $A_{CAP}$ is LOW and $\overline{A_{CAP}}$ is HIGH—meaning that the CAP line is coupled to pin B—then only $MN_A$ is operable (again, subject to being fully enabled by the ENABLE signal or signals to the driver control circuit 604). Thus, $MN_A$ is fully enabled, and thereafter controlled by the IN signal, when ENABLE=HIGH and $\overline{A_{CAP}}$ is HIGH.

MP0 is fully enabled, and thereafter controlled by the IN signal, when ENABLE=HIGH. When ENABLE=LOW, then $MN_A$, $MN_B$, and MP0 are all in a tristate (high impedance) mode. In general, it is preferable that PFET MP0 and the operable NFET ($MN_A$ or $MN_B$, depending on the states of the $A_{CAP}$ and $\overline{A_{CAP}}$ flag signals) not have overlapping ON states (for example, by adding rise and fall delay time differences between MP0 and MNx in the buffers 606 to provide "OFF before ON" operation).

TABLE 3 following shows the various possible input states, output states, and FET states for the example circuit shown in FIG. 6A. As should be clear, if multiple ENABLE inputs are used in a particular embodiment, then the circuit and corresponding truth and state table would necessarily be altered.

TABLE 3

| Inputs | | | | Outputs | | | | | FET States | | |
|---|---|---|---|---|---|---|---|---|---|---|---|
| | | | | NAND | NAND | NOR | NOR | NAND | | | |
| ENABLE | $\overline{A_{CAP}}$ | $A_{CAP}$ | IN | 612a | 612b | 608a | 608b | 610 | $MN_A$ | $MN_B$ | MP0 |
| 0 | 0 | 1 | 0 | 1 | 1 | 0 | 0 | 1 | OFF | OFF | OFF |
| 0 | 0 | 1 | 1 | 1 | 1 | 0 | 0 | 1 | OFF | OFF | OFF |
| 0 | 1 | 0 | 0 | 1 | 1 | 0 | 0 | 1 | OFF | OFF | OFF |
| 0 | 1 | 0 | 1 | 1 | 1 | 0 | 0 | 1 | OFF | OFF | OFF |
| 1 | 0 | 1 | 0 | 1 | 0 | 0 | 1 | 1 | OFF | ON | OFF |
| 1 | 0 | 1 | 1 | 1 | 0 | 0 | 0 | 0 | OFF | OFF | ON |
| 1 | 1 | 0 | 0 | 0 | 1 | 1 | 0 | 1 | ON | OFF | OFF |
| 1 | 1 | 0 | 1 | 0 | 1 | 0 | 0 | 0 | OFF | OFF | ON |

Figure 6B:
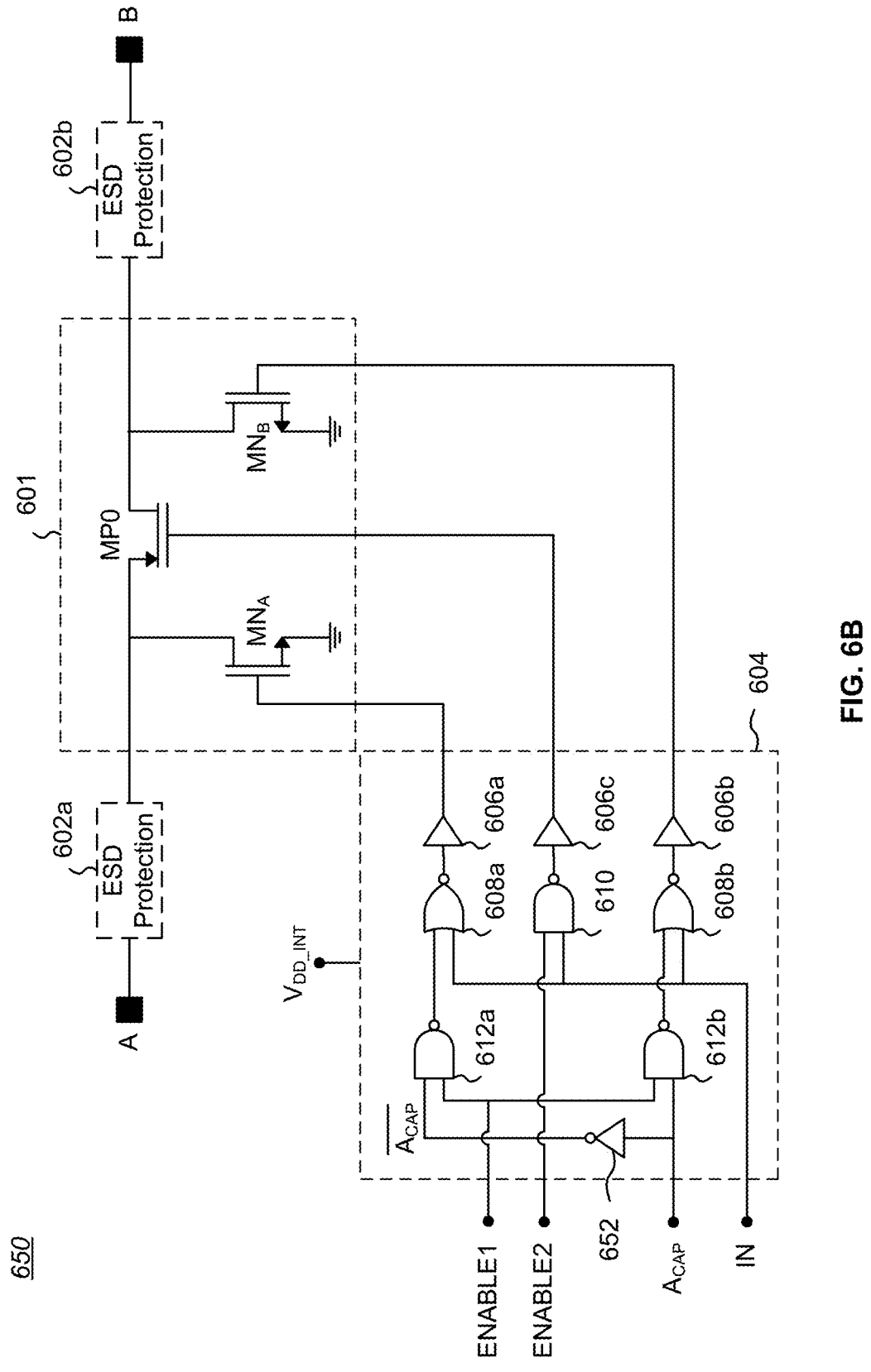
FIG. 6B is a schematic diagram of a hybrid output buffer having two ENABLE inputs to a modified driver control circuit.

FIG. 6B is a schematic diagram of a hybrid output buffer 650 having two ENABLE inputs to a modified driver control circuit 604'. In the illustrated example, a first signal, ENABLE1, controls the enabled/disabled state of NFETs $MN_A$ and $MN_B$, and a second signal, ENABLE2, controls the enabled/disabled state of MP0. FIG. 6B also shows how the $\overline{A_{CAP}}$ signal may be generated from the $A_{CAP}$ signal by using an inverter 652 as shown (the reverse is true as well, the $A_{CAP}$ signal may be generated from the $\overline{A_{CAP}}$ signal by reversion the connections of the inverter 652).

When the ENABLE1 and ENABLE2 signals have the same states, then TABLE 3 applies to the operation of the modified driver control circuit 604'. However, independently controlling the ENABLEx signals provides greater flexibility in controlling the hybrid output buffer 650; one example of such flexibility is described below.

Charging Circuitry for a Swappable Single-Conductor Interface

As noted above, a swappable-pin interface in a peripheral cannot use a conventional charging circuit to properly charge the CAP line from the I/O line regardless of A and B pin connections. The MP0 device from the hybrid output buffer 600, 650 can be adapted to advantageously assist in charging the storage capacitor C coupled to the CAP line during startup, basically until $V_{DD\_INT}$ gets within $V_{TP}$ (i.e., the $V_{TH}$ of the PMOS MP0 device) of the I/O line voltage ($V_{DD}$). However, there is also a need to periodically recharge the storage capacitor C after a sequence of I/O signals are imposed on the I/O line, since the I/O line is uncoupled from the CAP line during communication events.

Figure 7:
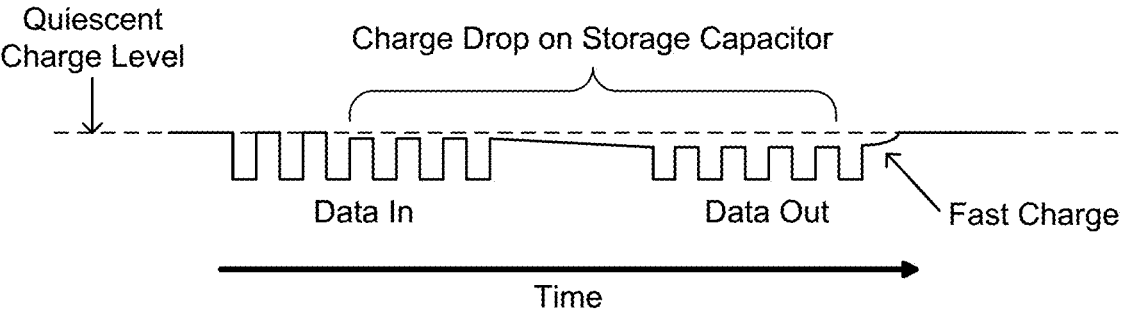
FIG. 7 is a timing diagram of a sequence of Data In and Data Out pulses on the I/O line of a peripheral.

As an example of the latter problem, FIG. 7 is a timing diagram of a sequence of Data In and Data Out pulses on the I/O line of a peripheral. During the Data In sequence, the PFET MP0 of the circuits of FIGS. 6A and 6B are turned OFF, thereby decoupling the storage capacitor C on the CAP line (regardless of which pin the CAP line is connected to) from the I/O line through MP0. Negative-going pulses on the I/O line are created during Data Out by momentarily turning ON the associated NFET ($MN_A$ or $MN_B$, depending on the states of the $A_{CAP}$ and $\overline{A_{CAP}}$ flag signals), in accordance with the applicable communications protocol, thereby grounding the I/O line. As a result, the charge on the storage capacitor C, which is still powering circuitry within the peripheral, begins to drop below a quiescent charge level. A slow charge circuit may not be able to timely replenish the charge on the storage capacitor C. Accordingly, the charge on the storage capacitor C needs to be replenished more quickly from time to time when there is significant data traffic on the I/O line (i.e., multiple commands to multiple peripherals, perhaps with significant read-back data being required of each peripheral, which consumes significant power). Generally, when there is little time between commands for the peripheral to recharge using a slow charge method, a fast-charge is desirable.

Figure 8:
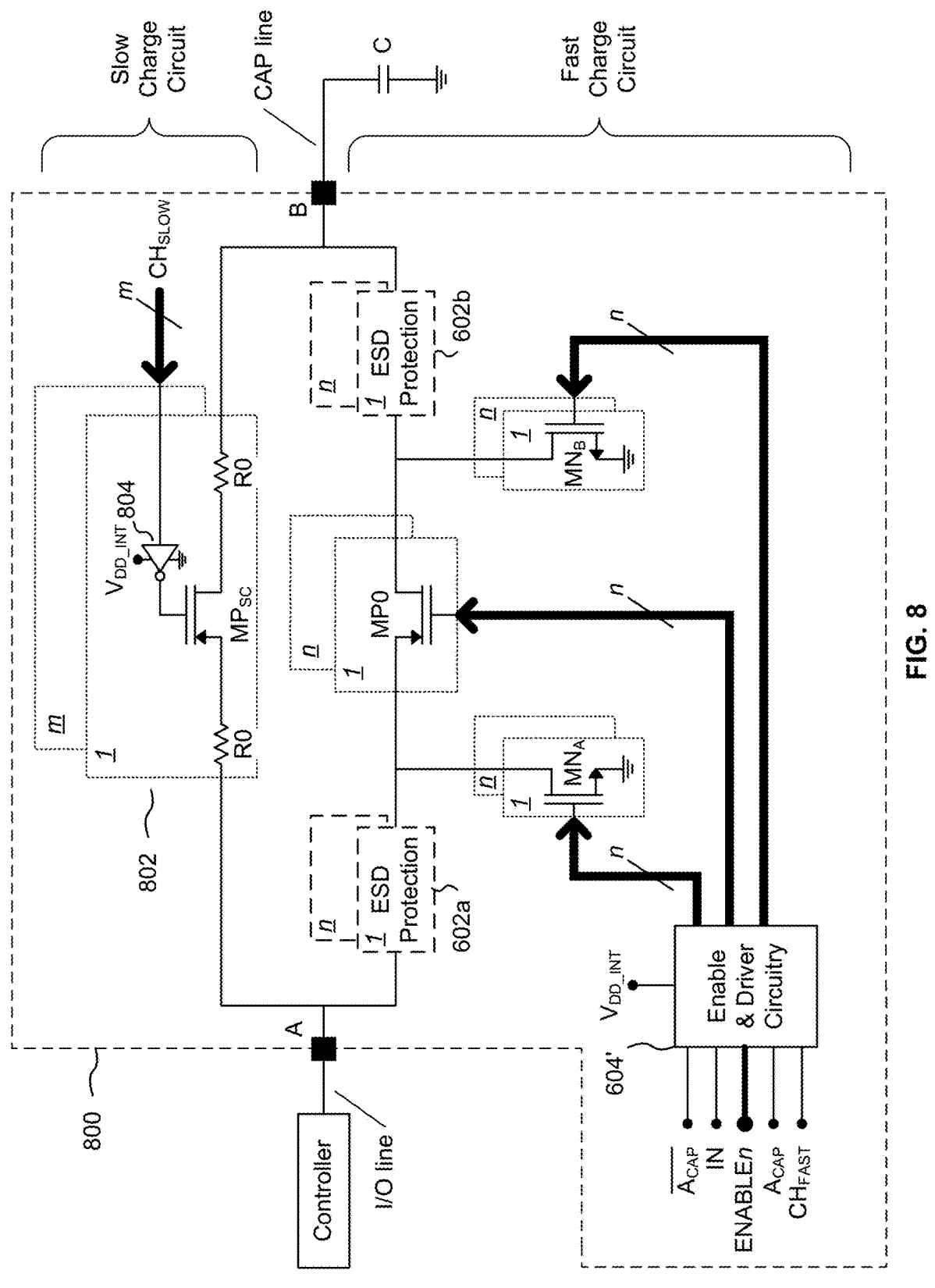
FIG. 8 is a block diagram of a single-conductor peripheral that includes a fast charge circuit and a slow charge circuit for charging or recharging the storage capacitor C.

The circuits of FIGS. 6A and 6B can be combined with additional circuitry to address both of these charging needs. For example, FIG. 8 is a block diagram of a single-conductor peripheral 800 that includes a fast charge circuit and a slow charge circuit for charging or recharging the storage capacitor C. In the illustrated example, pin A of the peripheral 800 is coupled to a controller 802 (e.g., a 1-Wire controller) while pin B is coupled to a storage capacitor C; of course, the two external components can be swapped as described above.

The fast charge circuit of the peripheral 800 includes the modified version of the hybrid output buffer 650 of FIG. 6B. In the illustrated example, the modifications include the addition of a $CH_{FAST}$ control line coupled to the driver control circuit 604'. The driver control circuit 604' functions in a manner similar to the driver control circuits 604 of FIGS. 6A and 6B, selecting which of NFETs $MN_A$ and $MN_B$ are operable and selectively enabling either the PFET MP0 or the operable NFET to respond to the state of the IN signal. The added $CH_{FAST}$ control line functions to affirmatively turn MP0 ON regardless of the state of the ENABLE or IN inputs to the driver control circuit 604', for example, by pulling the gate of MP0 low. In alternative embodiments, the same result can be obtained without using a dedicated $CH_{FAST}$ control line by enabling the PFET MP0 and forcing the IN line to be in a state (e.g., a logic "1") that causes MP0 to turn ON. In a variation of this latter approach, with an independent ENABLE2 line coupled to NAND gate 610 as in FIG. 6B, the NFETs $MN_A$ and $MN_B$ may be disabled using the ENABLE1 line while MP0 is enabled using the ENABLE2 line; MP0 can then be turned ON by forcing the IN line to a high state. In any case, when MP0 is ON (conducting), the I/O line will charge the CAP line through MP0.

The $CH_{FAST}$ (or equivalent) control line may be asserted or de-asserted under the control of a Port Control circuit 106 (see, e.g., FIG. 1A) or other communications control circuitry. For example, the $CH_{FAST}$ may be de-asserted during normal operations, and asserted from time to time during or after a data I/O sequence. When MP0 is turned ON (conducting) by the $CH_{FAST}$ control line or equivalent, a "fast charge mode" is activated. Charging of the CAP line from the I/O line through MP0 will be fast, slowed only be the impedance of the ESD protection circuits 602a, 602b (if present) and the charge level of the storage capacitor C. Referring to FIG. 7, the "Fast Charge" label shows rapid restoration of the charge level of the storage capacitor C back up to the quiescent charge level.

Also shown in FIG. 8 is that NFETs $MN_A$ and $MN_B$ and PFET MP0 may be implemented as stacks of parallel 1 . . . n devices. Stacking the devices in parallel enables lowering the resistance through the stack and may be useful for driving varying capacitive loads. In some embodiments, a single ENABLE signal may be used to enable or disable all of the devices in each stack.

In alternative embodiments, sets of corresponding NFETs $MN_A$ and $MN_B$ and PFET MP0 (along with associated ESD protection circuits 602a, 602b) may be considered a "unit cell", and multiple ENABLE signals may be used to control the number of operable unit cells. For example, two ENABLE lines, along with some conventional binary decoding logic, may be mapped to the gate control lines of 8 NFET/PFET unit cells, and may be configured to selectively enable or disable 0, 1, 4, or 8 unit cells. Other numbers of unit cells may be controlled by two ENABLE lines (e.g., 0, 2, 5, or 8 unit cells), and the number of unit cells and ENABLE lines may be varied as needed for a particular application. Enabling all NFET/PFET unit cells and turning the associated PFETs ON should result in the lowest effective ON resistance and the fastest charging of the storage capacitor C.

As noted above, during startup of a peripheral in accordance with the present invention, PFETs MP3 and MP4 in the supply switch circuit 214 are ON, and accordingly the I/O line (regardless of whether coupled to pin A or B) and the CAP line (again, regardless of whether coupled to pin A or B) will be coupled together. The result is that the coupled lines will provide an internal voltage supply $V_{DD\_INT}$, and voltage on the I/O line will begin to charge the storage capacitor C through the CAP line. One of the PFETs MP3 and MP4 will transition to an OFF (blocking) state when the corresponding signal applied to the respective gate switches to HIGH. Thus, if $A_{CAP}$=HIGH, then MP3 will turn OFF, and conversely, if $\overline{A_{CAP}}$=HIGH, then MP4 will turn OFF, in either case disconnecting the I/O line from the CAP line. In general, the storage capacitor C will not have fully charged before the disconnection occurs.

While one or a few unit cells of the fast charge circuit may be used to complete the initial charging of the storage capacitor C, it may be that the resistance through the PFETs $MP0_1$ . . . $MP0_n$ is too low and allows too much charge current to flow into the storage capacitor C during startup, potentially causing damage to the peripheral 800 or the controller 102. One solution is to fabricate one or a few unit cells with relatively large impedances (e.g., 1000 each) between the associated ESD protection circuits 602a, 602b and enable and turn ON those unit cells during the startup sequence and when the I/O is idle. When I/O activity is detected, those unit cells can be turned OFF until the end of the command period is determined. A circuit (not shown) may be used, for example, to compare the capacitor voltage to a reference voltage and turn the activated unit cells OFF when a sufficient charge level is reached on the storage capacitor C.

Another solution is to provide 1 . . . m separate slow charge circuit unit cells 802 that each include a PFET $MP_{SC}$ coupled in series with associated bracketing resistors R0 having a desired resistance value (e.g., about 100Ω each, giving a total resistance of about 200Ω) to provide a slower (below a damaging level) charging rate for the storage capacitor C. The resistors R0 of each unit cell 802 are in turn coupled to pins A or B, respectively, as shown in FIG. 8 (note that for bidirectional swappable uniformity, two bracketing resistors R0 are preferred, as the impedance may vary based on direction if only one higher resistor were used;

however, in some embodiments, a single resistor having a desired resistance value may be used). The gate of each PFET $MP_{SC}$ is coupled to an associated logic gate, such as an inverter 804, which may be powered by $V_{DD\_INT}$. In the illustrated example, the input to the inverter 804 is an associated $CH_{SLOW}$ control line. When $CH_{SLOW}$ is set to a logic 1 for any particular unit cell, the output of the associated inverter 804 is LOW, which turns the associated PFET $MP_{SC}$ ON. Conversely, when $CH_{SLOW}$ is set to a logic 0 for any particular unit cell, the output of the associated inverter 804 is HIGH, which turns the associated PFET $MP_{SC}$ OFF. By controlling the number of slow charge circuit unit cells that are ON during startup, the charging rate of the storage capacitor C can be controlled.

As should be appreciated, the unit cells in both the fast charge circuit and the slow charge circuit shown in FIG. 8 are fully bidirectional, and function as described regardless of A and B pin connections to the CAP and I/O lines. In addition, embodiments need not include both the fast charge circuit and the slow charge circuit, but may include just one or the other (so long as there is some circuit for the charging of capacitor C with a relatively high impedance (e.g., 200 ohms) that can be over-driven by the controller 102).

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 9:
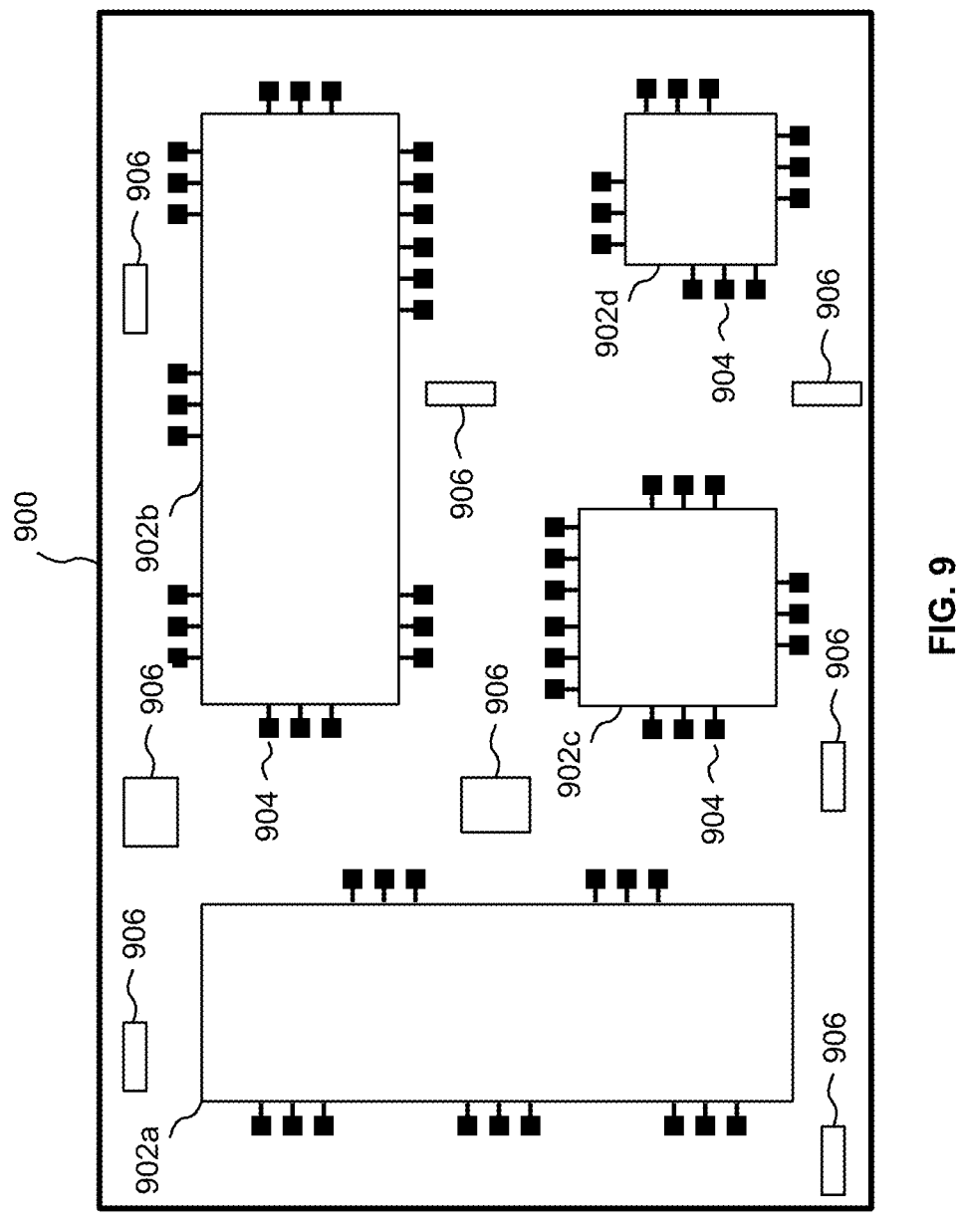
FIG. 9 is a top plan view of a substrate that may be, for example, a printed circuit board or chip module substrate (e.g., a thin-film tile).

As one example of further integration of embodiments of the present invention with other components, FIG. 9 is a top plan view of a substrate 900 that may be, for example, a printed circuit board or chip module substrate (e.g., a thin-film tile). In the illustrated example, the substrate 900 includes multiple ICs 902a-902d having terminal pads 904 which would be interconnected by conductive vias and/or traces on and/or within the substrate 900 or on the opposite (back) surface of the substrate 900 (to avoid clutter, the surface conductive traces are not shown and not all terminal pads are labelled). The ICs 902a-902d may embody, for example, temperature sensors, humidity sensors, and other circuitry. For example, IC 902d may incorporate an instance of a single-conductor peripheral 200 like the circuit shown in FIG. 2, augmented by the driver and charging circuits shown in FIGS. 6A, 6B, and/or 8.

The substrate 900 may also include one or more passive devices 906 embedded in, formed on, and/or affixed to the substrate 900. While shown as generic rectangles, the passive devices 906 may be, for example, filters, capacitors, inductors, transmission lines, resistors, planar antennae elements, transducers (including, for example, MEMS-based transducers, such as accelerometers, gyroscopes, micro-
phones, pressure sensors, etc.), batteries, etc., interconnected
by conductive traces on or in the substrate 900 to other
passive devices 906 and/or the individual ICs 902a-902d.
The front or back surface of the substrate 900 may be used
as a location for the formation of other structures.

Methods

Another aspect of the invention includes methods for pin
determination for 1-Wire and similar single-conductor inter-
faces. For example, FIG. 10 is a process flow chart 1000
showing one method for determining the characteristics of
respective signals on a first pin and a second pin of a
peripheral configured to be coupled to a single-conductor
communications bus. The method includes: determining
which signal on the first and the second pins rises fastest
during a startup period (Block 1002); outputting a first
selected logic state indicating that the first pin is coupled to
an input/output signal line and the second pin is coupled to
a storage capacitor (Block 1004); and outputting a second
selected logic state indicating that the first pin is coupled to
the storage capacitor and the second pin is coupled to the
input/output signal line (Block 1006).

Additional aspects of the above method may include one
or more of the following: generating a power good indica-
tion when a voltage on an internal voltage supply output
rises above a selected threshold; applying the power good
indication so as to prevent alteration of the first and second
selected logic states; and/or coupling a first electrostatic
discharge circuit to the first pin, and a second electrostatic
discharge circuit to the second pin.

As another example, FIG. 11 is a process flow chart 1100
showing one method for coupling electronic signals to a
swappable single conductor interface having a first pin and
a second pin. The method includes coupling a conduction
channel of a first transistor between the first pin and a
reference potential (Block 1102); coupling a conduction
channel of a second transistor between the second pin and
the reference potential (Block 1104); coupling a conduction
channel of a third transistor between the first and second pins
(Block 1106); making the conduction channel of the first
transistor conductive in response to a pin-connection flag
signal having a first state indicating that the second pin is
coupled to a storage capacitor, and in response to a first
enable signal (Block 1108); making the conduction channel
of the second transistor conductive in response to the
pin-connection flag signal having a second state indicating
that the first pin is coupled to a storage capacitor, and in
response to the first enable signal (Block 1110); and making
the conduction channel of the third transistor conductive in
response to a second enable signal (Block 1112), wherein the
enabled third transistor and the enabled one of the first and
second transistors have complementary conductive states
(Block 1114). Some embodiments may include coupling a
slow charge circuit between the first pin and the second pin.
Fabrication Technologies & Options While the examples above have mostly focused on the
1-Wire system, the invention may be used with other com-
munications bus architectures and protocols that provides
data, signaling, and power over a single conductor. As
should be clear to one of ordinary skill in the art, if desired,
the logic levels used to control the various elements of the
peripheral 200 shown in FIGS. 2, 6A, 6B, and/or 8 may be
inverted if complementary changes are made throughout; for
example, the S'R' latch 206 may be implemented as an active-HIGH circuit if suitable changes are made to the input
signals and output signals (e.g., by use of inverters as
needed).

The term "MOSFET", as used in this disclosure, includes
any field effect transistor (FET) having an insulated gate
whose voltage determines the conductivity of the transistor,
and encompasses insulated gates having a metal or metal-
like, insulator, and/or semiconductor structure. The terms
"metal" or "metal-like" include at least one electrically
conductive material (such as aluminum, copper, or other
metal, or highly doped polysilicon, graphene, or other elec-
trical conductor), "insulator" includes at least one insulating
material (such as silicon oxide or other dielectric material),
and "semiconductor" includes at least one semiconductor
material.

With respect to the figures referenced in this disclosure,
the dimensions for the various elements are not to scale;
some dimensions may be greatly exaggerated vertically
and/or horizontally for clarity or emphasis. In addition,
references to orientations and directions (e.g., "top", "bot-
tom", "above", "below", "lateral", "vertical", "horizontal",
etc.) are relative to the example drawings, and not neces-
sarily absolute orientations or directions.

Various embodiments of the invention can be imple-
mented to meet a wide variety of specifications. Unless
otherwise noted above, selection of suitable component
values is a matter of design choice. Various embodiments of
the invention may be implemented in any suitable integrated
circuit (IC) technology (including but not limited to MOS-
FET structures), or in hybrid or discrete circuit forms.
Integrated circuit embodiments may be fabricated using any
suitable substrates and processes, including but not limited
to standard bulk silicon, high-resistivity bulk CMOS, sili-
con-on-insulator (SOI), and silicon-on-sapphire (SOS).
Unless otherwise noted above, embodiments of the inven-
tion may be implemented in other transistor technologies
such as bipolar, BiCMOS, LDMOS, BCD, GaAs HBT, GaN
HEMT, GaAs pHEMT, and MESFET technologies. When
using these technologies, the term "gate" used in the dis-
closure above should be taken to refer to a control input,
such as a gate, base, or similarly functioning element.
However, embodiments of the invention are particularly
useful when fabricated using an SOI or SOS based process,
or when fabricated with processes having similar character-
istics. Fabrication in CMOS using SOI or SOS processes
enables circuits with low power consumption, the ability to
withstand high power signals during operation due to FET
stacking, good linearity, and high frequency operation (i.e.,
radio frequencies up to and exceeding 300 GHz). Monolithic
IC implementation is particularly useful since parasitic
capacitances generally can be kept low (or at a minimum,
kept uniform across all units, permitting them to be com-
pensated) by careful design.

Voltage levels may be adjusted, and/or voltage and/or
logic signal polarities reversed, depending on a particular
specification and/or implementing technology (e.g., NMOS,
PMOS, or CMOS, and enhancement mode or depletion
mode transistor devices). Component voltage, current, and
power handling capabilities may be adapted as needed, for
example, by adjusting device sizes, serially "stacking" com-
ponents (particularly FETs) to withstand greater voltages,
and/or using multiple components in parallel to handle
greater currents. Additional circuit components may be
added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An output buffer for a swappable single conductor interface having a first pin and a second pin, the output buffer including:
   (a) a P-type field-effect transistor (PFET) having a conduction channel coupled between the first and second pins;
   (b) a first N-type field-effect transistor (NFET) having a conduction channel coupled between the first pin and circuit ground;
   (c) a second N-type field-effect transistor (NFET) having a conduction channel coupled between the second pin and circuit ground; and
   (d) a driver control circuit having:
      (1) a first input configured to be coupled to a signal line bearing a pin-connection flag signal having a first state indicating that the first pin is coupled to a storage capacitor and a second state indicating that the second pin is coupled to the storage capacitor;
      (2) a second input configured to be coupled to an ENABLE line;
      (3) a third input configured to be coupled to a command and data line;
      (4) a first output coupled to a gate of the first NFET;
      (5) a second output coupled to a gate of the second NFET; and
      (6) a third output coupled to a gate of the PFET.

2. The output buffer of claim 1, wherein the driver control circuit is configured to make one of the first NFET or the second NFET operable as a function of the state of the pin-connection flag signal if a signal on the ENABLE line has a first state, and to make the PFET operable if the signal on the ENABLE line has the first state, and wherein the operable PFET and the operable one of the first NFET and second NFET have complementary states in response to command and data signals on the command and data line.

3. An output buffer for a swappable single conductor interface having a first pin couplable to one of an input/output line or a storage capacitor, and a second pin couplable to the other one of the input/output line or the storage capacitor, the output buffer including:
   (a) a first transistor having a conduction channel coupled between the first pin and a reference potential, and configured to be selectively operable in response to a pin-connection flag signal having a first state and non-operable in response to the pin-connection flag signal having a second state;
   (b) a second transistor having a conduction channel coupled between the second pin and the reference potential, and configured to be selectively operable in response to the pin-connection flag signal having the second state and non-operable in response to the pin-connection flag signal having the first state; and
   (c) a third transistor having a conduction channel coupled between the first and second pins, and configured to be selectively operable;
      wherein the operable third transistor and the operable one of the first and second transistors have complementary states in response to applied command and data signals; and
      wherein the operable third transistor is selectively settable to a conductive state to convey charge from the input/output line to the storage capacitor through a low-impedance conductive path.

4. The output buffer of claim 3, wherein the first and second transistors are NFETs and the third transistor is a PFET.

5. The output buffer of claim 3, wherein each of the first and second transistors include a stack of parallel-connected NFETs and the third transistor includes a stack of parallel-connected PFETs.

6. The output buffer of claim 3, wherein the first state of the pin-connection flag signal indicates that the second pin is coupled to a storage capacitor, and the second state of the pin-connection flag signal indicates that the first pin is coupled to the storage capacitor.

7. The output buffer of claim 3, further including a slow charge circuit including:
   (a) a first resistor coupled to the first pin;
   (b) a second resistor coupled to the second pin;
   (c) a slow charge transistor having a conduction channel coupled between the first resistor and the second resistor, and having a gate; and
   (d) a logic gate having an output coupled to the gate of the slow charge transistor, and an input configured to be coupled to a control signal;
      wherein the slow charge transistor is selectively settable to a conductive state in response to the application of the control signal to the input of the logic gate so as to convey charge from the input/output line to the storage capacitor; and
      wherein the resistance of the first and second resistors is sufficient to limit a charging rate of the storage capacitor to below a specified level.

8. A slow charge circuit for a swappable single conductor interface having a first pin couplable to one of an input/output line or a storage capacitor, and a second pin couplable to the other one of the input/output line or the storage capacitor, the slow charge circuit including at least one unit cell each including:
   (a) a first resistor coupled to the first pin;
   (b) a second resistor coupled to the second pin;
   (c) a transistor having a conduction channel coupled between the first resistor and the second resistor, and having a gate; and (d) a logic gate having an output coupled to the gate of the transistor, and an input configured to be coupled to a control signal;

wherein the transistor of at least one unit cell is selectively settable to a conductive state in response to the application of the control signal to the input of the logic gate so as to convey charge from the input/output line to the storage capacitor; and wherein the resistance of the first and second resistors is sufficient to limit a charging rate of the storage capacitor to below a specified level.

9. The slow charge circuit of claim 8, wherein the transistor in each unit cell is a PFET.

10. The slow charge circuit of claim 8, wherein the transistor in each unit cell is a PFET and the logic gate within each cell is an inverter.

11. The slow charge circuit of claim 8, wherein the total resistance of the first and second resistors in each unit cell is about 200Ω.

12. A method for determining the characteristics of respective signals on a first pin and a second pin of a peripheral configured to be coupled to a single-conductor communications bus, including:

(a) determining which signal on the first and the second pins rises fastest during a startup period;

(b) outputting a first selected logic state indicating that the first pin is coupled to an input/output signal line and the second pin is coupled to a storage capacitor; and (c) outputting a second selected logic state indicating that the first pin is coupled to the storage capacitor and the second pin is coupled to the input/output signal line.

13. A method for coupling electronic signals to a swappable single conductor interface having a first pin and a second pin, the method including:

(a) coupling a conduction channel of a first transistor between the first pin and a reference potential;

(b) coupling a conduction channel of a second transistor between the second pin and the reference potential;

(c) coupling a conduction channel of a third transistor between the first and second pins; and (d) making the conduction channel of the first transistor conductive in response to a pin-connection flag signal having a first state indicating that the second pin is coupled to a storage capacitor, and in response to a first enable signal;

(e) making the conduction channel of the second transistor conductive in response to the pin-connection flag signal having a second state indicating that the first pin is coupled to a storage capacitor, and in response to the first enable signal; and (f) making the conduction channel of the third transistor conductive in response to a second enable signal;

wherein the enabled third transistor and the enabled one of the first and second transistors have complementary conductive states.

14. The method of claim 13, further including coupling a slow charge circuit between the first pin and the second pin.

* * * * *